United States Patent
Boldt et al.

(10) Patent No.: US 7,184,335 B2
(45) Date of Patent: Feb. 27, 2007

(54) ELECTRONIC MEMORY APPARATUS, AND METHOD FOR DEACTIVATING REDUNDANT BIT LINES OR WORD LINES

(75) Inventors: Sven Boldt, Aschheim (DE); Erwin Thalmann, Villach (AT)

(73) Assignee: Infineon Technologies AG, Munich (DE)

(*) Notice: Subject to any disclaimer, the term of this patent is extended or adjusted under 35 U.S.C. 154(b) by 138 days.

(21) Appl. No.: 11/102,071

(22) Filed: Apr. 8, 2005

(65) Prior Publication Data
US 2005/0243636 A1   Nov. 3, 2005

(30) Foreign Application Priority Data
Apr. 27, 2004   (DE) ...................... 10 2004 020 546

(51) Int. Cl.
*G11C 29/00*   (2006.01)
(52) U.S. Cl. ...................... 365/201; 365/200
(58) Field of Classification Search ................ 365/201, 365/200, 230.06
See application file for complete search history.

(56) References Cited

U.S. PATENT DOCUMENTS

| | | | | |
|---|---|---|---|---|
| 5,617,364 | A * | 4/1997 | Hatakeyama | 365/200 |
| 5,652,725 | A * | 7/1997 | Suma et al. | 365/200 |
| 6,259,636 | B1 * | 7/2001 | Fukuda et al. | 365/200 |
| 6,392,938 | B1 * | 5/2002 | Choi et al. | 365/200 |
| 7,100,090 | B2 * | 8/2006 | Kamata | 365/200 |

FOREIGN PATENT DOCUMENTS

DE   101 01 268 A1   7/2002

OTHER PUBLICATIONS

German Office Action dated Dec. 17, 2004.

* cited by examiner

*Primary Examiner*—Anh Phung
(74) *Attorney, Agent, or Firm*—Jenkins, Wilson, Taylor & Hunt, P.A.

(57) ABSTRACT

Electronic memory apparatus, and method for deactivating redundant bit lines or word lines An electronic memory apparatus (100) having a memory cell array (101), a column address decoding unit (102) for decoding a column addressing signal (105) and for actuating an addressed bit line in the memory cell array (101), a column redundancy activation unit (103) for activating a redundant bit line when a currently used bit line has been determined to be faulty during testing of the memory apparatus (100), a row address decoding unit (202) for decoding a row addressing signal (205) and for actuating an addressed word line in the memory cell array (101), and a row redundancy activation unit (203) for activating a redundant word line when a currently used word line has been determined to be faulty during testing of the memory apparatus (100). A column deactivation unit deactivates unused, redundant bit lines and those bit lines which have been determined to be faulty during testing of the memory apparatus, and a row deactivation unit (204) deactivates unused, redundant word lines and those word lines which have been determined to be faulty during testing of the memory apparatus (100).

7 Claims, 2 Drawing Sheets

ELECTRONIC MEMORY APPARATUS, AND METHOD FOR DEACTIVATING REDUNDANT BIT LINES OR WORD LINES

TECHNICAL FIELD

The present invention relates in general to an electronic memory apparatus for storing data and to a method for electronically storing data in a memory cell array which has memory cells arranged in rows and columns.

BACKGROUND ART

Specifically, the present invention relates to an electronic memory apparatus for storing data, having:

a) a memory cell array which has memory cells arranged in rows and columns;

b) a column address decoding unit for decoding a column addressing signal and for actuating an addressed bit line in the memory cell array;

c) a column redundancy activation unit for activating a redundant bit line when a currently used bit line has been determined to be faulty during testing of the memory apparatus;

d) a row address decoding unit for decoding a row addressing signal and for actuating an addressed word line in the memory cell array; and e) a row redundancy activation unit for activating a redundant word line when a currently used word line has been determined to be faulty during testing of the memory apparatus.

As circuit size and circuit complexity increase, an increasing number of components, for example transistors, are produced on a single circuit chip (electronic circuit unit). In this case, problems are caused by an operating current increasing with the number of components, since this results in an increase in the power loss from the overall circuit arrangement. It is therefore necessary to reduce the power loss from the individual structures upon a further reduction in the size of circuit structures and an associated increase in the scale of integration for circuits.

FIG. 2 shows a memory cell array based on the prior art. The memory cell array is addressed by addressing signals (column addressing signal SAS, row addressing signal ZAS). A column decoder Col. dec. or a row decoder Row dec. decode the respective addressing signals and supply them to the memory cell array (Array).

To improve reliability of the memory module and/or to provide a repair option for faulty bit lines and/or word lines, it has been found to be advantageous in the case of the conventional circuit arrangement for redundancy activation circuits RA to be provided which activate redundant bit lines and/or word lines when a currently used bit line and/or word line is faulty. It is also possible to switch from a currently used bit line and/or word line to a redundant bit line or word line when a fault occurs in a memory cell area of the memory cell array which is associated with the bit line or word line.

It should be pointed out that redundant bit lines or word lines are provided not only in memory modules but also in numerous other electronic components in order to be able to repair faulty bit lines or word lines. In this case, accessing addresses for faulty bit lines and word lines involves only the addresses being switched, i.e. rerouted to redundant bit lines and word lines. The faulty bit lines and word lines and the associated circuit parts are disadvantageously also supplied with a current. In this case, the "bleeder circuits" have a small leakage current continually flowing through them, since in a memory module such bleeder circuits are used to pull bit lines or word lines to a predetermined potential and to keep them there for as long as the corresponding bit line or word line is not being addressed.

When the electronic memory apparatus has been tested at wafer level, the bit lines and word lines identified as being faulty are replaced with redundant bit lines and word lines. Although the faulty bit lines and word lines and the bit lines and word lines which are not brought in, i.e. not used, for repair are not used for correct circuit operation of the memory module or of the electronic memory apparatus, they disadvantageously cause a leakage current. Such a leakage current can disadvantageously cause power loss when there are a large number of unused and/or faulty bit lines.

The reason for this is that a bit line which has been identified as being faulty during testing of the electronic memory apparatus at wafer level has, by way of example, a short circuit to ground potential or to a supply voltage potential.

Another drawback is that determining whether it is necessary to use a redundant bit line to which addresses have been rerouted requires additional determination time. The reason for this is that it is first necessary to check whether an appropriately addressed bit line or word line or the previously determined redundant bit line and/or word line needs to be activated. Following such determination, only the correspondingly selected bit line and/or word line can be activated, while the other bit line and/or word line needs to be disconnected.

An electronic memory apparatus based on the prior art, as shown in FIG. 2, for example, has a large number of bit lines and/or word lines which are not deactivated. Unused bit lines and/or word lines or faulty bit lines and/or word lines thus cause a problem in that a large leakage current results in high power loss. Another drawback is that activation is possible only after the relevant bit line and/or word line has been determined by an evaluation value unit.

SUMMARY OF THE INVENTION

It is therefore an object of the present invention to provide an electronic memory apparatus and a method for storing data in which power loss is reduced and in which, in particular, leakage currents on bit lines and/or word lines are avoided, which can contribute to power loss.

The invention achieves this object by means of an electronic memory apparatus having the features of Patent claim 1.

The object is also achieved by a method specified in Patent claim 3.

Further refinements of the invention can be found in the subclaims.

It is a fundamental concept of the invention to disconnect or deactivate unused and/or redundant bit lines and word lines in an electronic memory apparatus completely such that they are no longer supplied with power and hence also cannot contribute to an increase in the power loss from the overall circuit arrangement. The essence of the invention is the provision of a column deactivation unit and a row deactivation unit for deactivating bit lines and for deactivating word lines. This means that unused circuit parts can be deactivated in line with the invention.

A fundamental advantage of the present invention is that automatically disconnecting unused redundant bit lines and/or word lines and faulty bit lines and/or word lines avoids leakage currents. This minimizes power loss from the overall circuit arrangement.

Another advantage is that the addressed bit lines and/or word lines can be activated more quickly. The reason for this is that rerouted (repaired) and redundant bit lines and/or word lines can be addressed simultaneously, with the fact that a repaired bit line and/or word line has been disconnected completely meaning that no signal is driven by these circuits.

This achieves the advantage that incorrect activation of a bit line and/or word line, caused by a timing problem, for example, is eliminated.

The inventive electronic memory apparatus for storing data essentially has:

a) a memory cell array which has memory cells arranged in rows and columns;

b) a column address decoding unit for decoding a column addressing signal and for actuating an addressed bit line in the memory cell array;

c) a column redundancy activation unit for activating a redundant bit line when a currently used bit line has been determined to be faulty during testing of the memory apparatus;

d) a row address decoding unit for decoding a row addressing signal and for actuating an addressed word line in the memory cell array;

e) a row redundancy activation unit for activating a redundant word line when a currently used word line has been determined to be faulty during testing of the memory apparatus, with the electronic memory apparatus also having a column deactivation unit for deactivating unused, redundant bit lines and those bit lines which have been determined to be faulty during testing of the memory apparatus; and f) a row deactivation unit for deactivating unused, redundant word lines and those word lines which have been determined to be faulty during testing of the memory apparatus. In addition, the inventive method for electronically storing data in a memory apparatus which has a memory cell array having memory cells arranged in rows and columns essentially has the following steps:

a) a column address decoding unit is used to decode a column addressing signal, and an addressed bit line in the memory cell array is actuated using the decoded column addressing signal;

b) a column redundancy activation unit is used to activate a redundant bit line when a currently used bit line has been determined to be faulty during testing of the memory apparatus;

c) a row address decoding unit is used to decode a row addressing signal, and an addressed word line in the memory cell array is actuated using the decoded row addressing signal;

d) a row redundancy activation unit is used to activate a redundant word line when a currently used word line has been determined to be faulty during testing of the memory apparatus, with unused, redundant bit lines and those bit lines which have been determined to be faulty during testing of the memory apparatus being deactivated using a column deactivation unit, and unused, redundant word lines and those word lines which have been determined to be faulty during testing of the memory apparatus being deactivated using a row deactivation unit.

The subclaims contain advantageous developments and improvements of the respective subject matter of the invention.

In line with one preferred development of the present invention, the column deactivation unit for deactivating bit lines and/or the row deactivation unit for deactivating word lines are integrated together with the memory cell array.

In line with a further preferred development of the present invention, the unused, redundant bit lines and those bit lines which have been determined to be faulty during testing of the memory apparatus are automatically placed at a predetermined potential using the column deactivation unit.

In line with yet a further preferred development of the present invention, the unused, redundant word lines and those word lines which have been determined to be faulty during testing of the memory apparatus are automatically placed at a predetermined potential using the row deactivation unit.

In line with yet a further preferred development of the present invention, a bit line is also deactivated using the column deactivation unit when a fault occurs in a memory cell area of the memory cell array which is associated with the bit line.

In line with yet a further preferred development of the present invention, a word line is also deactivated using the row deactivation unit when a fault occurs in a memory cell area of the memory cell array which is associated with the word line.

Exemplary embodiments of the invention are illustrated in the drawings and are explained in more detail in the description below.

DETAILED DESCRIPTION OF THE INVENTION

In the figures, identical reference symbols denote components or steps which are the same or have the same function.

Figure 1:
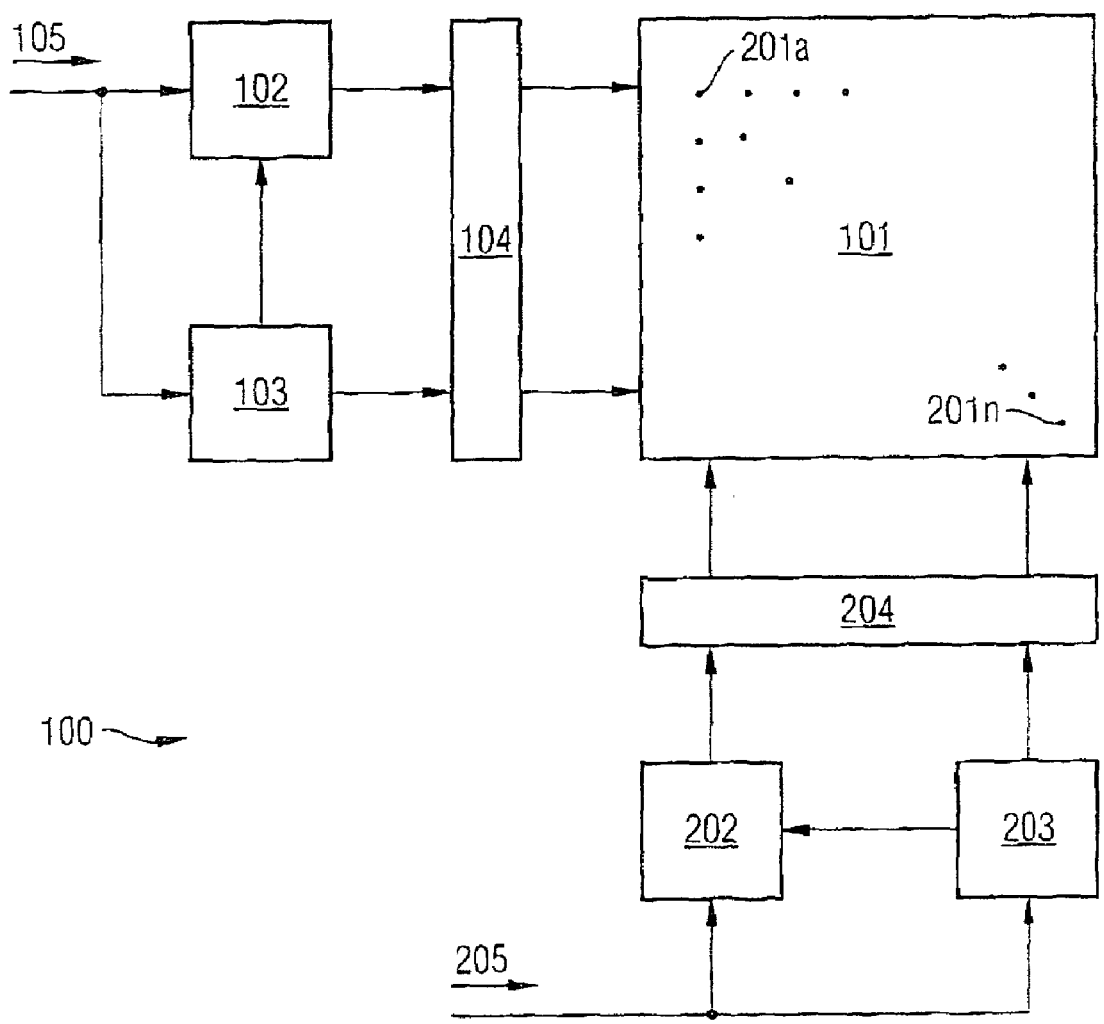
FIG. 1 shows a block diagram of a memory apparatus having a memory cell array, address decoding units, redundancy activation units and deactivation units based on a preferred exemplary embodiment of the present invention.

FIG. 1 shows a schematic block diagram of a memory apparatus 100 which encompasses a memory cell array 101 and address decoding units 102 and 202, redundancy activation units 103 and 203 and deactivation units 104 and 204 in each case for columns and rows and for bit lines and word lines.

The memory cell array 101 has memory cells 210a–201n which are arranged in rows and columns and which can be actuated by appropriate signals, for example a column addressing signal 105 and a row addressing signal 205.

It should be pointed out that the column addressing signal 105 and the row addressing signal 205 can be supplied to the memory apparatus 100 as a common addressing signal.

In the exemplary embodiment of the present invention which is shown in FIG. 1, the column addressing signal 105 is supplied both to a column address decoding unit 102 and to a column redundancy activation unit 103, while the row addressing signal 205 is supplied both to a row address decoding unit 202 and to a row redundancy activation unit 203. The column address decoding unit decodes the column addressing signal 105, so that it can then be used to actuate a bit line addressed using the column addressing signal 105 in the memory cell array 101.

In line with the invention, the decoded column addressing signal 105 is not supplied to the memory cell array 101 directly, but rather is routed via a column deactivation unit 104. In a similar manner, the row addressing signal 205 is decoded in a row address decoding unit 202 and is used to actuate an addressed word line in the memory cell array 101.

The row addressing signal 205 is supplied both to the row address decoding unit 202 and to the row redundancy activation unit 203. In line with the invention, the decoded row addressing signal 205 is not supplied to the memory cell array 101 directly, but rather is routed via a row deactivation unit 204.

The column redundancy activation unit 103 and the row redundancy activation unit 203 are used to activate redundant bit lines and word lines when currently used bit lines and word lines have been determined to be faulty during testing of the memory apparatus 100. The column redundancy activation unit 103 is thus used to activate a redundant bit line when a currently used bit line has been determined to be faulty during testing of the memory apparatus 100.

In addition, the row redundancy activation unit 203 is used to activate a redundant word line when a currently used word line has been determined to be faulty during testing of the memory apparatus. An output signal from the column redundancy activation unit 103 containing information about the currently rerouted bit line is supplied to the column deactivation unit 104, while an output signal from the row redundancy activation unit 203 containing information about a rerouted word line is supplied to the row deactivation unit 204.

In this context, the column deactivation unit 104 is used to deactivate unused, redundant bit lines and those bit lines which have been determined to be faulty during testing of the memory apparatus 100, while the row deactivation unit 204 is used to deactivate unused, redundant word lines and those word lines which have been determined to be faulty during testing of the memory apparatus.

It should be pointed out, although this is not illustrated in FIG. 1, that the column deactivation unit 104 for deactivating bit lines and/or the row deactivation unit 204 for deactivating word lines can be in a form integrated together with the memory cell array 101.

Bleeder circuits (not shown) can place the unused, redundant bit lines and those bit lines which have been determined to be faulty during testing of the memory apparatus 100 at a predetermined potential automatically. In addition, the unused, redundant word lines and those word lines which have been determined to be faulty during testing of the memory apparatus 100 can automatically be placed at a predetermined potential. The predetermined potential may be a ground potential, a potential for a supply voltage or an arbitrary potential in between.

The inventive method for electronically storing data in a memory apparatus 100 which has a memory cell array 101 having memory cells 201–201*n* arranged in rows and columns actuates an addressed bit line and/or word line using an appropriate address decoding unit, i.e. a column address decoding unit 102 and/or a row address decoding unit 202.

Such actuation involves first checking whether the actuated address has been replaced with a redundant bit line and/or word line, with the correspondingly selected bit line and/or word line being activated. When a redundant bit line and/or word line is activated, activation of the faulty bit line and/or word line is suppressed, i.e. the corresponding address is rerouted.

The information about the use of redundant bit lines and/or word lines is stored in the deactivation units, i.e. the column deactivation unit 104 relating to the bit lines and the row deactivation unit 204 relating to the word lines. The information stored in this way is used, in line with the invention, to disconnect the unused and/or faulty bit lines and/or word lines completely such that they do not bring about any leakage currents which can contribute to an increase in the power loss from the overall circuit arrangement.

Another advantage is that the addressed bit lines and/or word lines can now be activated more quickly because the redundant, used bit lines and/or word lines and the other (unused and faulty) bit lines and/or word lines can be addressed simultaneously. Since a faulty or unused bit line and/or word line is disconnected completely, there is thus also no signal being driven, which means that problems resulting from incorrectly activated bit lines and/or word lines, for example caused by a timing problem, are avoided.

Figure 2:
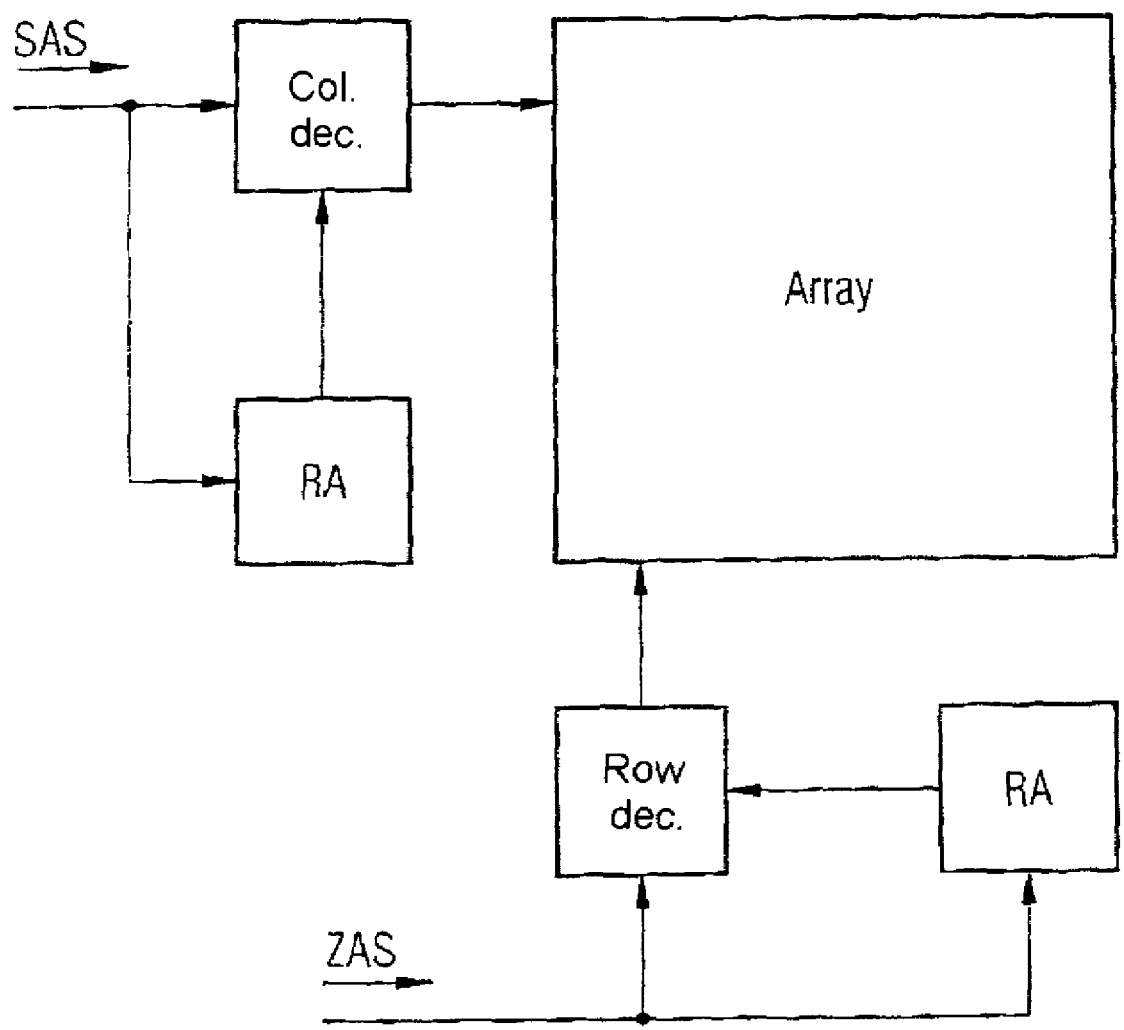
FIG. 2 shows a memory apparatus based on the prior art.

In respect of the conventional memory apparatus for storing data which is shown in FIG. 2, reference is made to the introduction to the description.

Although the present invention has been described above using preferred exemplary embodiments, it is not limited thereto but rather can be modified in a wide variety of ways.

The invention is also not limited to the cited application options.

LIST OF REFERENCE SYMBOLS

In the figures, identical reference symbols denote components or steps which are the same or have the same function.

100 memory apparatus
101 memory cell array
102 column address decoding unit
103 column redundancy activation unit
104 column deactivation unit
105 column addressing signal
201*a*–201*n* memory cells
202 row address decoding unit
203 row redundancy activation unit
204 row deactivation unit
205 row addressing signal

What is claimed is:

1. Electronic memory apparatus for storing data, having:
   a) a memory cell array which has memory cells arranged in rows and columns;
   b) a column address decoding unit for decoding a column addressing signal and for actuating an addressed bit line in the memory cell array;
   c) a column redundancy activation unit for activating a redundant bit line when a currently used bit line has been determined to be faulty during testing of the memory apparatus;
   d) a row address decoding unit for decoding a row addressing signal and for actuating an addressed word line in the memory cell array; and
   e) a row redundancy activation unit for activating a redundant word line when a currently used word line has been determined to be faulty during testing of the memory apparatus,
   wherein the electronic memory apparatus also has:
   f) a column deactivation unit for deactivating unused, redundant bit lines and those bit lines which have been determined to be faulty during testing of the memory apparatus; and
   g) a row deactivation unit for deactivating unused, redundant word lines and those word lines which have been determined to be faulty during testing of the memory apparatus.

2. Apparatus according to claim 1, wherein the column deactivation unit for deactivating bit lines and/or the row deactivation unit for deactivating word lines are integrated together with the memory cell array.

3. Method for electronically storing data in a memory apparatus which has a memory cell array having memory cells arranged in rows and columns, having the following steps:
- a) using a column address decoding unit to decode a column addressing signal, and an addressed bit line in the memory cell array is actuated using the decoded column addressing signal;
- b) using a column redundancy activation unit to activate a redundant bit line when a currently used bit line has been determined to be faulty during testing of the memory apparatus;
- c) using a row address decoding unit to decode a row addressing signal, and an addressed word line in the memory cell array is actuated using the decoded row addressing signal;
- d) using a row redundancy activation unit to activate a redundant word line when a currently used word line has been determined to be faulty during testing of the memory apparatus, wherein the method also has the following steps:
- e) deactivating unused, redundant bit lines and those bit lines which have been determined to be faulty during testing of the memory apparatus using a column deactivation unit; and
- f) deactivating unused, redundant word lines and those word lines which have been determined to be faulty during testing of the memory apparatus using a row deactivation unit.

4. Method according to claim 3, wherein the unused, redundant bit lines and those bit lines which have been determined to be faulty during testing of the memory apparatus are automatically placed at a predetermined potential using the column deactivation unit.

5. Method according to claim 3, wherein the unused, redundant word lines and those word lines which have been determined to be faulty during testing of the memory apparatus are automatically placed at a predetermined potential using the row deactivation unit.

6. Method according to claim 3, wherein a bit line is also deactivated using the column deactivation unit when a fault occurs in a memory cell area of the memory cell array which is associated with the bit line.

7. Method according to claim 3, wherein a word line is also deactivated using the row deactivation unit when a fault occurs in a memory cell area of the memory cell array which is associated with the word line.

* * * * *